United States Patent [19]
Toda

[11] Patent Number: 5,760,523
[45] Date of Patent: Jun. 2, 1998

[54] SURFACE ACOUSTIC WAVE TRANSDUCING DEVICE

[76] Inventor: Kohji Toda, 1-49-18 Futaba, Yokosuka 239, Japan

[21] Appl. No.: 694,982

[22] Filed: Aug. 9, 1996

[51] Int. Cl.⁶ .................................................. H01L 41/08
[52] U.S. Cl. ................................................. 310/313 A
[58] Field of Search ........................ 310/313 R, 313 A, 310/313 B; 333/150–155, 193–196

[56] References Cited

U.S. PATENT DOCUMENTS 5,235,233  8/1993  Yamamoto ................... 310/313 A

*Primary Examiner*—Mark O. Budd

[57] ABSTRACT

A surface acoustic wave transducing device comprising a piezoelectric substrate, a nonpiezoelectric plate and an interdigital transducer formed on an upper end surface of the piezoelectric substrate. One end surface of the nonpiezoelectric plate is mounted on the upper end surface of the piezoelectric substrate through the interdigital transducer. When using the surface acoustic wave transducing device as an input device, an electric signal is applied to the interdigital transducer. In this time, a surface acoustic wave is excited on an area, in contact with the interdigital transducer, of the upper end surface of the piezoelectric substrate, and then, the surface acoustic wave is transmitted to the nonpiezoelectric plate. When using the surface acoustic wave transducing device as an output device, a surface acoustic wave transmitted from the nonpiezoelectric plate to an area, in contact with the interdigital transducer, of the upper end surface of the piezoelectric substrate, is transduced to an electric signal at the interdigital transducer.

4 Claims, 6 Drawing Sheets

SURFACE ACOUSTIC WAVE TRANSDUCING DEVICE

BACKGROUND OF THE INVENTION

1. Field of the Invention

The present invention relates to a surface acoustic wave device for transducing an electric signal to a surface acoustic wave on a nonpiezoelectric plate having a piezoelectric substrate with at least an interdigital transducer.

2. Description of the Prior Art

Conventional methods for exciting the acoustic vibration on a nonpiezoelectric plate generally include a wedge-shaped transducer with a bulk wave vibrator for vibrating a nonpiezoelectric plate indirectly, or a piezoelectric thin film transducer for vibrating a nonpiezoelectric plate directly. The wedge-shaped transducer is mainly used for a non-destruction evaluation by ultrasound under a comparative low frequency operation alone because of the difficulty on manufacturing accuracy of the wedge angle and so on. The piezoelectric thin film transducer consists of a nonpiezoelectric plate, a piezoelectric thin film mounted on the nonpiezoelectric plate and made from ZnO and others, and interdigital transducers exciting the acoustic vibration on the nonpiezoelectric plate. Because of various transmission characteristics of the interdigital transducers with various structures, the piezoelectric thin film transducer is used as a high frequency device, however has operation frequencies limited to the UHF and VHF bands, and has some problems on manufacturing and mass production.

Thus, there are some problems on response time, sensitivity, durability, manufacturing, mass production, difficulty in use, operation frequencies, and high voltage operation with high power consumption in conventional transducers.

SUMMARY OF THE INVENTION

An object of the present invention is to provide a surface acoustic wave transducing device capable of exciting a surface acoustic wave in a nonpiezoelectric plate under low power consumption with low voltage.

Another object of the present invention is to provide a surface acoustic wave transducing device capable of transducing a surface acoustic wave in a nonpiezoelectric plate to an electric signal with a quick response time.

Another object of the present invention is to provide a surface acoustic wave transducing device being easy to support a piezoelectric substrate having a nonpiezoelectric plate thereon.

A still other object of the present invention is to provide a surface acoustic wave transducing device excellent in durability, manufacturing, mass-production.

A still further object of the present invention is to provide a surface acoustic wave transducing device with a small size which is very light in weight and has a simple structure.

According to one aspect of the present invention there is provided a surface acoustic wave transducing device comprising a piezoelectric substrate, a nonpiezoelectric plate, and an interdigital transducer formed on an upper end surface of the piezoelectric substrate. A lower end surface of the nonpiezoelectric plate is mounted on the upper end surface of the piezoelectric substrate through the interdigital transducer. The thickness of the piezoelectric substrate is larger than approximately three times an interdigital periodicity p of the interdigital transducer. The thickness d of the nonpiezoelectric plate is smaller than the interdigital periodicity p.

When operating the surface acoustic wave transducing device as an input device, the interdigital transducer receives an electric signal with a frequency approximately corresponding to the interdigital periodicity p, and excites a surface acoustic wave of the zeroth mode and the higher order modes on an area, in contact with the interdigital transducer, of the upper end surface of the piezoelectric substrate. The surface acoustic wave having the wavelength approximately equal to the interdigital periodicity p is transmitted to an upper end surface of the nonpiezoelectric plate. In this time, the phase velocity of the surface acoustic wave of the zeroth mode is equal to the phase velocity of the Rayleigh wave traveling on the piezoelectric substrate alone under the electrically shorted condition, and the phase velocity of the surface acoustic wave of the higher order modes is equal to the phase velocity of the Rayleigh wave traveling on the piezoelectric substrate alone under the electrically opened condition.

When operating the surface acoustic wave transducing device as an output device, the interdigital transducer transduces a surface acoustic wave, with the zeroth mode and the higher order modes, transmitted from the upper end surface of the nonpiezoelectric plate to an area, in contact with the interdigital transducer, of the upper end surface of the piezoelectric substrate, to an electric signal with a frequency approximately corresponding to the interdigital periodicity p. In this time, the surface acoustic wave has the wavelength approximately equal to the interdigital periodicity p. In addition, the phase velocity of the surface acoustic wave of the zeroth mode is equal to the phase velocity of the Rayleigh wave traveling on the piezoelectric substrate alone under the electrically shorted condition, and the phase velocity of the surface acoustic wave of the higher order modes is equal to the phase velocity of the Rayleigh wave traveling on the piezoelectric substrate alone under the electrically opened condition.

According to another aspect of the present invention there is provided a nonpiezoelectric plate made of a material such that the phase velocity of the surface acoustic wave traveling on the nonpiezoelectric plate alone is lower than that traveling on the piezoelectric substrate alone.

According to other aspect of the present invention there is provided a supporting board cemented to a lower end surface of the piezoelectric substrate.

According to further aspect of the present invention there is provided a piezoelectric substrate made of a piezoelectric ceramic, the polarization axis thereof being parallel to the thickness direction thereof.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
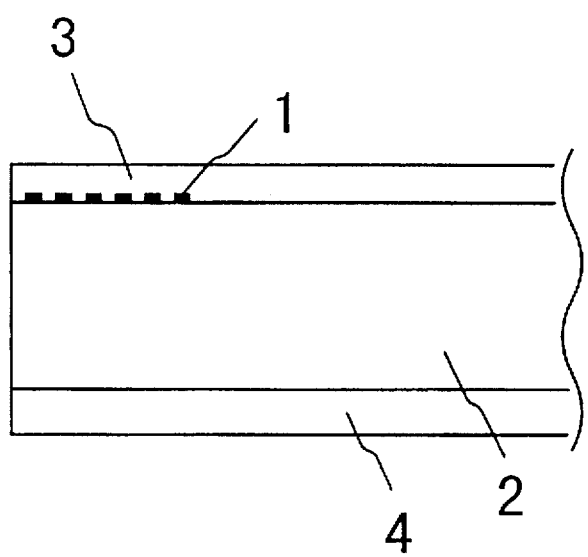
FIG. 1 shows a sectional view of a surface acoustic wave transducing device according to an embodiment of the present invention.

FIG. 1 shows a sectional view of a surface acoustic wave transducing device according to an embodiment of the present invention. The surface acoustic wave transducing device comprises interdigital transducer 1, piezoelectric substrate 2 having an upper—and a lower end surfaces running perpendicular to the thickness direction thereof, nonpiezoelectric plate 3 and supporting board 4. Piezoelectric substrate 2, of which material is TDK-101A (Brand name), has a dimension of 1.5 mm in thickness. Interdigital transducer 1, made from aluminium thin film, is mounted on an upper end surface of piezoelectric substrate 2. Nonpiezoelectric plate 3, made from a glass or a polymer such as acrylate resin, teflon and so on, has a dimension of 0.15 mm in thickness, and a lower end surface of nonpiezoelectric plate 3 is mounted on the upper end surface of piezoelectric substrate 2 through interdigital transducer 1. When nonpiezoelectric plate 3 is made from a glass, the glass is cemented on all over the upper end surface of piezoelectric substrate 2 through an epoxy resin with thickness of about 20 μm. When nonpiezoelectric plate 3 is made from a polymer, all over the upper end surface of piezoelectric substrate 2 is coated with the polymer directly. A lower end surface of piezoelectric substrate 2 is cemented on supporting board 4.

Figure 2:
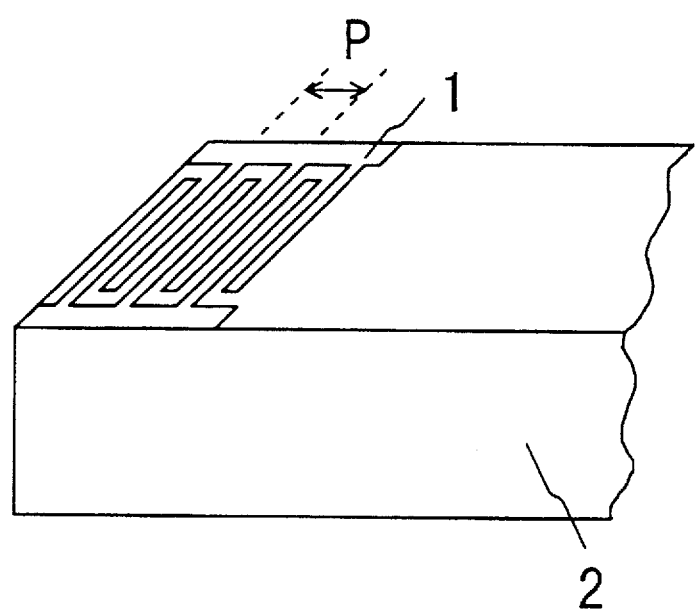
FIG. 2 shows a perspective view of the surface acoustic wave transducing device in FIG. 1.

FIG. 2 shows a perspective view of the surface acoustic wave transducing device in FIG. 1. FIG. 2 shows only piezoelectric substrate 2 and interdigital transducer 1, having a regular-type construction and consisting of ten finger pairs with an interdigital periodicity p of 460 μm.

When operating the surface acoustic wave transducing device as an input device, an electric signal having a frequency approximately corresponding to the interdigital periodicity p of interdigital transducer 1 is applied to interdigital transducer 1. In this time, the surface acoustic wave, of the zeroth mode and the higher order modes, having the wavelength approximately equal to the interdigital periodicity p of interdigital transducer 1, is excited on an area, in contact with interdigital transducer 1, of the upper end surface of piezoelectric substrate 2. The surface acoustic wave excited on the area of the upper end surface of piezoelectric substrate 2 is transmitted to an upper end surface of nonpiezoelectric plate 3. Thus, the surface acoustic wave transducing device in FIG. 1 has a small size which is very light in weight and has a simple structure.

If the phase velocity of the zeroth mode surface acoustic wave is approximately equal to the phase velocity of the Rayleigh wave traveling on piezoelectric substrate 2 alone under the electrically shorted condition, and the phase velocity of the higher order mode surface acoustic wave is approximately equal to the phase velocity of the Rayleigh wave traveling on piezoelectric substrate 2 alone under the electrically opened condition, the transducing efficiency from the electric signal to the surface acoustic wave increases.

If the thickness of piezoelectric substrate 2 is larger than three times the interdigital periodicity p of interdigital transducer 1, and the thickness d of nonpiezoelectric plate 3 is smaller than the interdigital periodicity p, the surface acoustic wave excited on the area, in contact with interdigital transducer 1, of the upper end surface of piezoelectric substrate 2, is transmitted to nonpiezoelectric plate 3 effectively. In addition, it is possible to support the lower end surface of piezoelectric substrate 2 directly.

If using a material, as nonpiezoelectric plate 3, such that the phase velocity of the surface acoustic wave traveling on nonpiezoelectric plate 3 alone is lower than that traveling on piezoelectric substrate 2 alone, the surface acoustic wave is transmitted to nonpiezoelectric plate 3 effectively without a leakage of the surface acoustic wave on the inside of piezoelectric substrate 2. Accordingly, it is possible to operate the surface acoustic wave transducing device in FIG. 1 under low power consumption with low voltage, and moreover, it is possible to support the lower end surface of piezoelectric substrate 2 directly.

If using a piezoelectric ceramic having the polarization axis parallel to the thickness direction thereof, as piezoelectric substrate 2, the surface acoustic wave of the zeroth mode and the higher order modes is excited on the area, in contact with interdigital transducer 1, of the upper end surface of piezoelectric substrate 2 effectively, and the transducing efficiency from the electric signal to the surface acoustic wave increases.

When operating the surface acoustic wave transducing device as an output device, a surface acoustic wave of the zeroth mode and the higher order modes, transmitted from the upper end surface of nonpiezoelectric plate 3 to an area, in contact with interdigital transducer 1, of the upper end surface of piezoelectric substrate 2, is transduced to an electric signal at interdigital transducer 1, the electric signal having a frequency approximately corresponding to the interdigital periodicity p, the surface acoustic wave having the wavelength approximately equal to the interdigital periodicity p.

If the phase velocity of the zeroth mode surface acoustic wave is approximately equal to the phase velocity of the Rayleigh wave traveling on piezoelectric substrate 2 alone under the electrically shorted condition, and the phase velocity of the higher order mode surface acoustic wave is approximately equal to the phase velocity of the Rayleigh wave traveling on piezoelectric substrate 2 alone under the electrically opened condition, the transducing efficiency from the surface acoustic wave to the electric signal increases, and the electric signal is delivered at interdigital transducer 1 with a quick response time.

If the thickness of piezoelectric substrate 2 is larger than three times the interdigital periodicity p of interdigital transducer 1, and the thickness d of nonpiezoelectric plate 3 is smaller than the interdigital periodicity p, the surface acoustic wave is delivered as the electric signal at interdigital transducer 1 effectively without a leakage of the surface acoustic wave on the inside of piezoelectric substrate 2. Accordingly, it is possible to operate the surface acoustic wave transducing device in FIG. 1 under low power consumption with low voltage, in addition, it is possible to support the lower end surface of piezoelectric substrate 2 directly.

If using a material, as nonpiezoelectric plate 3, such that the phase velocity of the surface acoustic wave traveling on nonpiezoelectric plate 3 alone is lower than that traveling on piezoelectric substrate 2 alone, the surface acoustic wave is delivered as the electric signal at interdigital transducer 1 effectively without a leakage of the surface acoustic wave on the inside of piezoelectric substrate 2. Therefore, it is possible to support the lower end surface of piezoelectric substrate 2 directly.

If using a piezoelectric ceramic having the polarization axis parallel to the thickness direction thereof, as piezoelectric substrate 2, the surface acoustic wave in nonpiezoelectric plate 3 is transmitted to the area, in contact with interdigital transducer 1, of the upper end surface of piezoelectric substrate 2 effectively, and the transducing efficiency from the surface acoustic wave to the electric signal increases.

Figure 3:
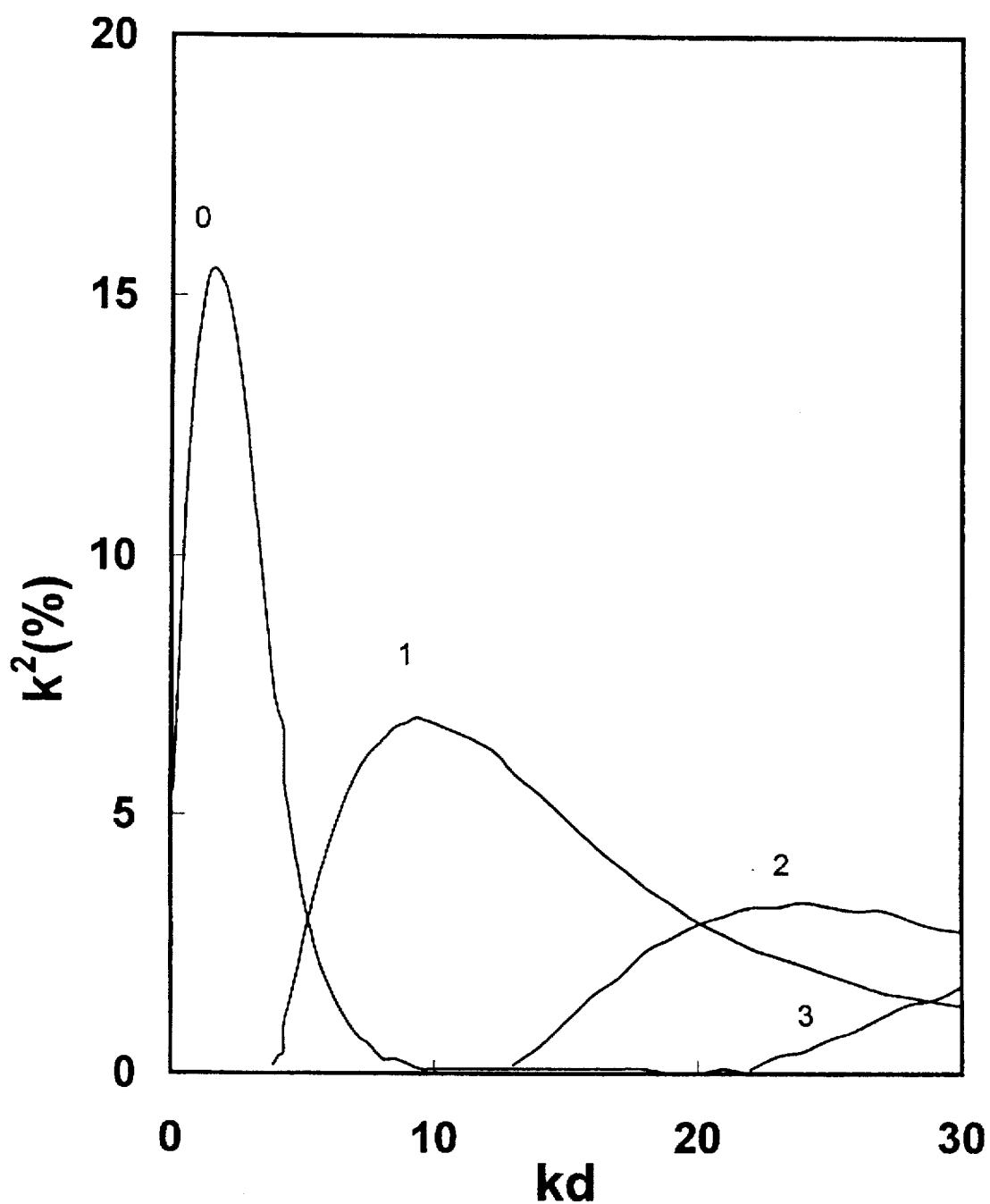
FIG. 3 shows a relationship between the electromechanical coupling constant $k^2$ and the product kd of the wave number k of the surface acoustic wave and the thickness d of nonpiezoelectric plate 3.

FIG. 3 shows a relationship between the electromechanical coupling constant $k^2$ calculated from the difference between the phase velocity under electrically opened condition and that under electrically shorted condition of piezoelectric substrate 2, and the product kd of the wave number k of the surface acoustic wave and the thickness d of nonpiezoelectric plate 3. In FIG. 3, nonpiezoelectric plate 3 is made from a glass having a shear wave velocity of 2297 m/s and a longitudinal wave velocity of 4156 m/s traveling on the glass alone. The velocities of 2297 m/s and 4156 m/s are about 0.9 times the velocities of a shear—and a longitudinal waves, 2340 m/s and 4390 m/s, respectively, in piezoelectric substrate 2 alone. An electric energy applied to interdigital transducer 1 is most easily transduced to the zeroth mode surface acoustic wave when the kd value is approximately 1.6, then the $k^2$ value is approximately 15.5% being the maximum value. An electric energy applied to interdigital transducer 1 is also transduced to the surface acoustic wave with more difficulty in proportion to the higher order modes. It is clear that the $k^2$ value of 15.5% is worthy in comparison that a crystallized $LiNbO_3$ used as a popular piezoelectric body for exciting the surface acoustic wave generally has the $k^2$ value of approximately 5%.

Figure 4:
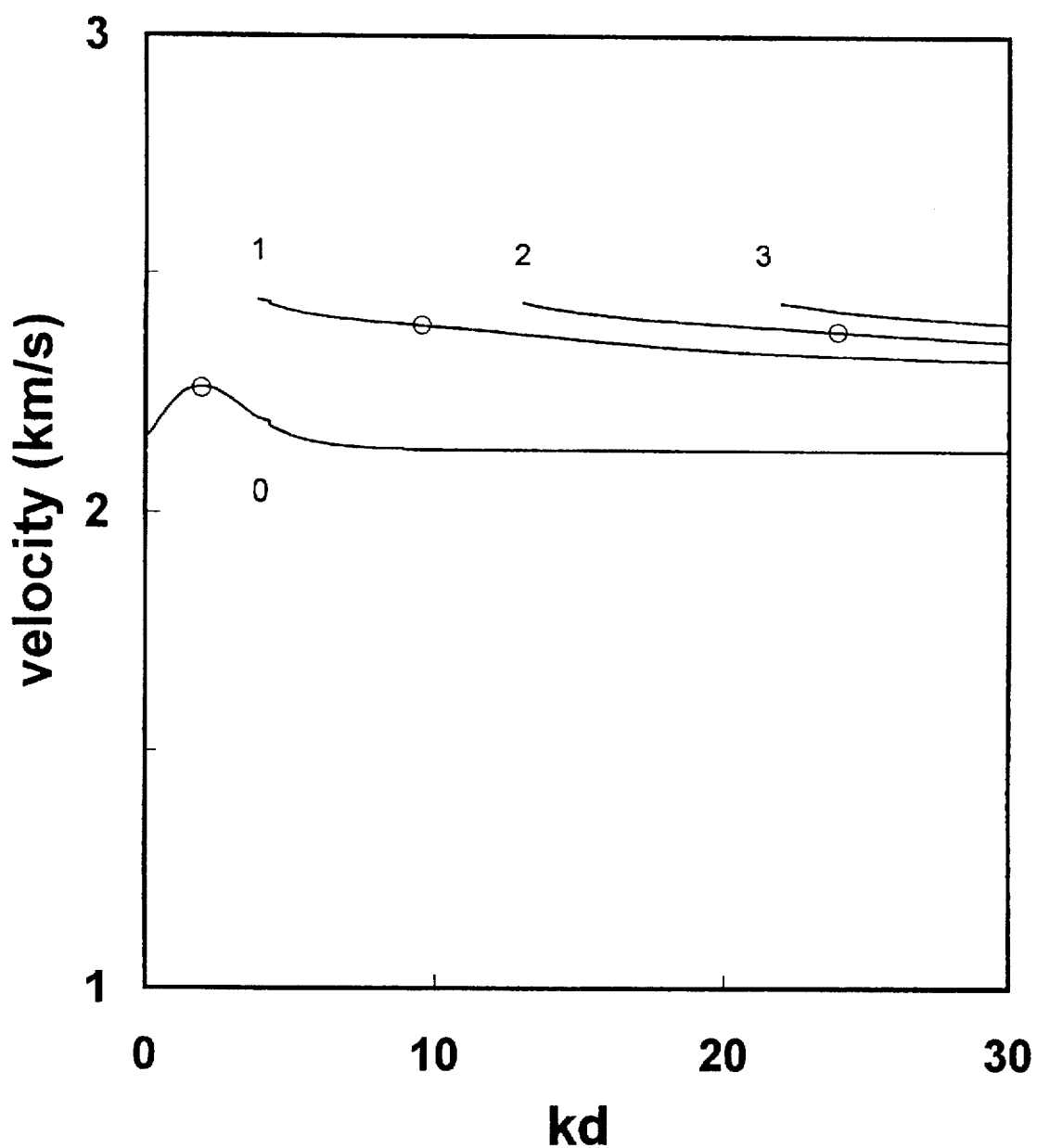
FIG. 4 shows a relationship between the phase velocity of the surface acoustic wave for each mode on the upper end surface of piezoelectric substrate 2, and the kd value.

FIG. 4 shows a relationship between the phase velocity of the surface acoustic wave for each mode on the upper end surface of piezoelectric substrate 2, and the kd value. In FIG. 4, nonpiezoelectric plate 3 is made from the same glass as FIG. 3. There is a cut-off frequency for each higher order mode, except for the zeroth mode. The kd value at each mark $\bigcirc$ has the maximum $k^2$ value where an electric energy applied to interdigital transducer 1 is most easily transduced to the surface acoustic wave, the maximum $k^2$ value being obtained from FIG. 3. The phase velocity of the zeroth mode surface acoustic wave at the mark $\bigcirc$ is 2170 m/s, which is approximately equal to the phase velocity of the Rayleigh wave traveling on piezoelectric substrate 2 alone under the electrically shorted condition, the phase velocity of the Rayleigh wave being 2150 m/s. The phase velocity of the higher order mode surface acoustic wave at the mark $\bigcirc$ is approximately 2370 m/s, which is approximately equal to the phase velocity of the Rayleigh wave traveling on piezoelectric substrate 2 alone under the electrically opened condition, the phase velocity of the Rayleigh wave being 2340 m/s.

Figure 5:
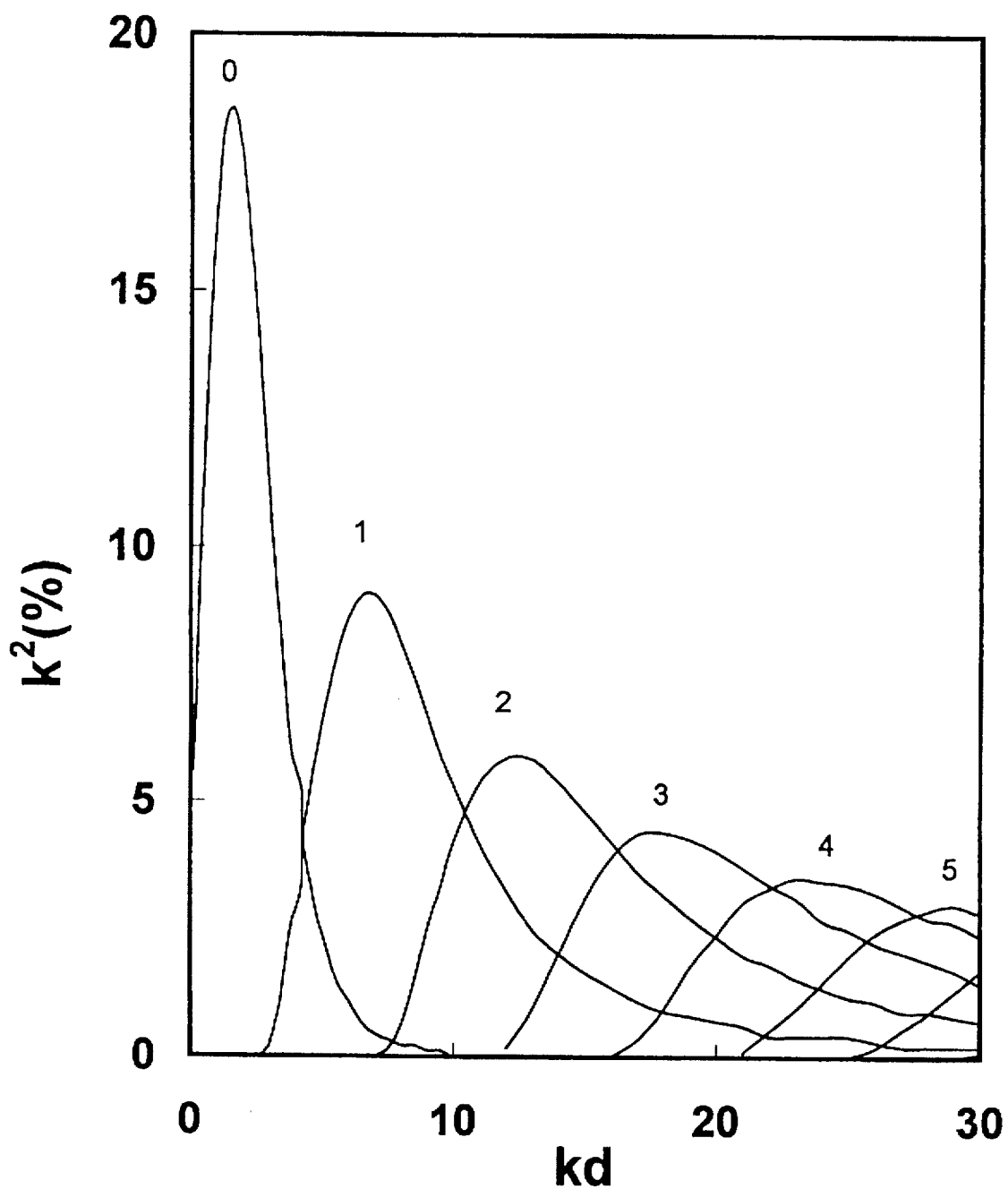
FIG. 5 shows a relationship between the $k^2$ value and the kd value.

FIG. 5 shows a relationship between the $k^2$ value and the kd value. In FIG. 5, nonpiezoelectric plate 3 is made from a glass having a shear wave velocity of 1989 m/s and a longitudinal wave velocity of 3598 m/s traveling on the glass alone. The velocities of 1989 m/s and 3598 m/s are about 0.8 times the velocities of a shear—and a longitudinal waves, 2340 and 4390 m/s, respectively, in piezoelectric substrate 2 alone. An electric energy applied to interdigital transducer 1 is most easily transduced to the zeroth mode surface acoustic wave when the kd value is approximately 1.6, then the $k^2$ value is approximately 18.5% being the maximum value. An electric energy applied to interdigital transducer 1 is also transduced to the surface acoustic wave with more difficulty in proportion to the higher order modes.

Figure 6:
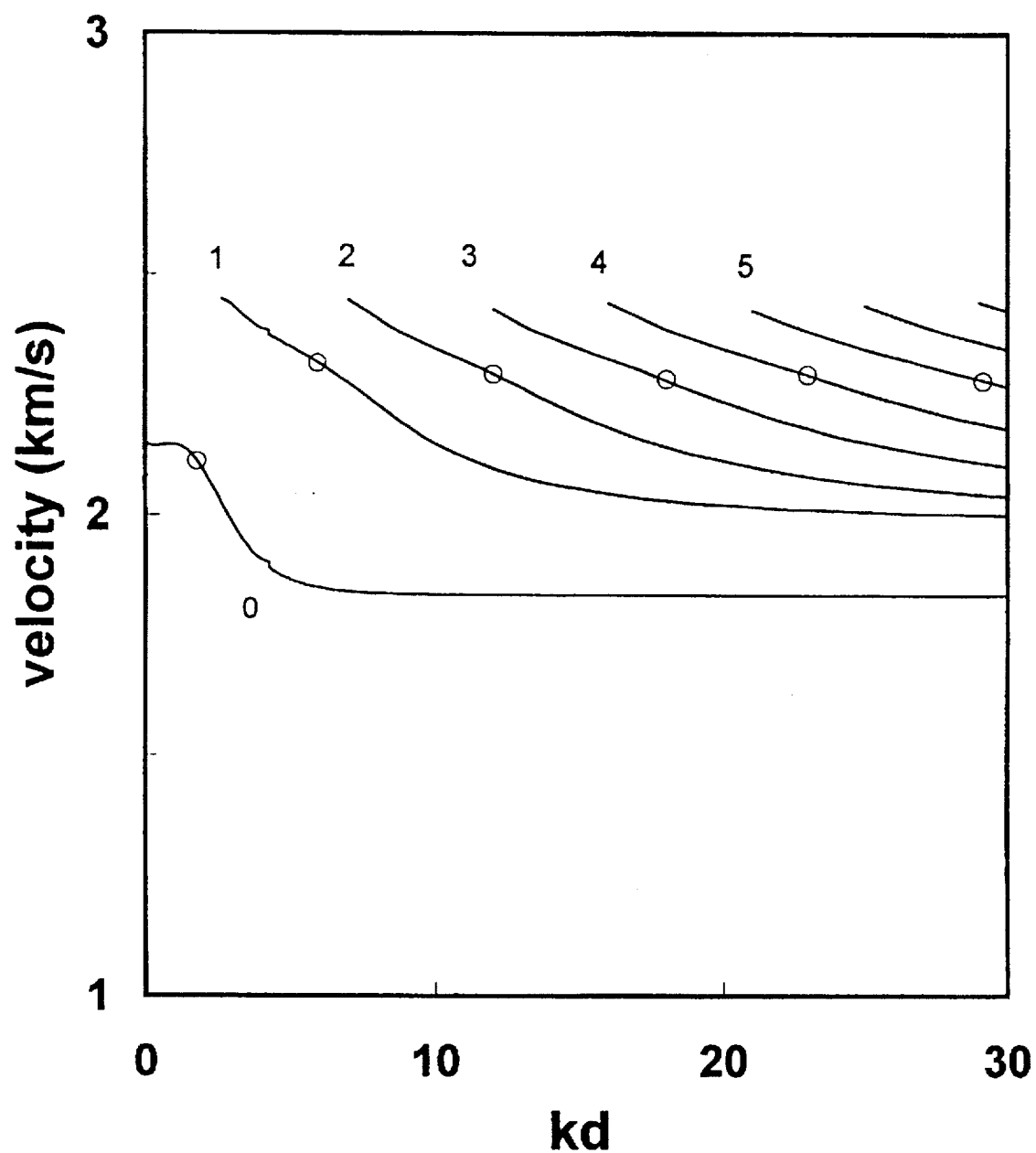
FIG. 6 shows a relationship between the phase velocity of the surface acoustic wave for each mode on the upper end surface of piezoelectric substrate 2, and the kd value.

FIG. 6 shows a relationship between the phase velocity of the surface acoustic wave for each mode on the upper end surface of piezoelectric substrate 2, and the kd value. In FIG. 6, nonpiezoelectric plate 3 is made from the same glass as FIG. 5. There is a cut-off frequency for each higher order mode, except for the zeroth mode. The kd value at each mark $\bigcirc$ has the maximum $k^2$ value where an electric energy applied to interdigital transducer 1 is most easily transduced to the surface acoustic wave, the maximum $k^2$ value being obtained from FIG. 5. The phase velocity of the zeroth mode surface acoustic wave at the mark $\bigcirc$ is 2095 m/s, which is lower than the phase velocity (2170 m/s) of the zeroth mode surface acoustic wave in FIG. 4, and is approximately equal to the phase velocity of the Rayleigh wave traveling on piezoelectric substrate 2 alone under the electrically shorted condition, the phase velocity of the Rayleigh wave being 2150 m/s. The phase velocity of the higher order mode surface acoustic wave at the mark $\bigcirc$ is approximately 2300 m/s, which is lower than the phase velocity (2370 m/s) of the higher order mode surface acoustic wave in FIG. 4, and is approximately equal to the phase velocity of the Rayleigh wave traveling on piezoelectric substrate 2 alone under the electrically opened condition, the phase velocity of the Rayleigh wave being 2340 m/s.

It is clear from FIGS. 3–6 that an electric energy applied to interdigital transducer 1 is most easily transduced to the zeroth mode surface acoustic wave having the phase velocity approximately equal to the phase velocity of the Rayleigh wave traveling on piezoelectric substrate 2 alone under the electrically shorted condition, and is transduced to the higher order mode surface acoustic wave having the phase velocity approximately equal to the phase velocity of the Rayleigh wave traveling on piezoelectric substrate 2 alone under the electrically opened condition. In addition, the phase velocity of the surface acoustic wave for each mode, transmitted from piezoelectric substrate 2 to nonpiezoelectric plate 3 becomes lower, when using a material, as nonpiezoelectric plate 3, where the velocity of the shear wave and the longitudinal wave traveling on the material alone is lower. In the same way, the zeroth mode surface acoustic wave having the phase velocity approximately equal to the phase velocity of the Rayleigh wave traveling on piezoelectric substrate 2 alone under the electrically shorted condition is most easily transduced to an electric signal at interdigital transducer 1. The higher order mode surface acoustic wave having the phase velocity approximately equal to the phase velocity of the Rayleigh wave traveling on piezoelectric substrate 2 alone under the electrically opened condition is transduced to an electric signal sufficiently.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A surface acoustic wave transducing device comprising:

a piezoelectric substrate made of a piezoelectric ceramic having an upper—and a lower end surfaces running perpendicular to the thickness direction thereof, the polarization axis thereof being parallel to said thickness direction;

a nonpiezoelectric plate having an upper—and a lower end surfaces running perpendicular to the direction of the thickness d thereof; and an interdigital transducer formed on said upper end surface of said piezoelectric substrate, said lower end surface of said nonpiezoelectric plate being cemented on said upper end surface of said piezoelectric substrate through said interdigital transducer, the thickness of said piezoelectric substrate being larger than approximately three times an interdigital periodicity p of said interdigital transducer, said thickness d of said nonpiezoelectric plate being not only smaller than said interdigital periodicity p but also larger than 0.25 times said interdigital periodicity p, said interdigital periodicity p having a dimension larger than 40 μm, said interdigital transducer receiving an electric signal with a frequency approximately corresponding to said interdigital periodicity p, exciting a surface acoustic wave of the zeroth mode and the higher order modes on an area, in contact with said interdigital transducer, of said upper end surface of said piezoelectric substrate, and transmitting said surface acoustic wave having the wavelength approximately equal to said interdigital periodicity p to said upper end surface of said nonpiezoelectric plate without a leakage of said surface acoustic wave on the inside of said piezoelectric substrate, the phase velocity of said surface acoustic wave of said zeroth mode being equal to the phase velocity of the Rayleigh wave traveling on said piezoelectric substrate alone under the electrically shorted condition, the phase velocity of said surface acoustic wave of said higher order modes being equal to the phase velocity of the Rayleigh wave traveling on said piezoelectric substrate alone under the electrically opened condition, said nonpiezoelectric plate being made of a material such that the phase velocity of the surface acoustic wave traveling on said nonpiezoelectric plate alone is lower than that traveling on said piezoelectric substrate alone, said nonpiezoelectric plate having a higher transducing efficiency from said electric signal to said surface acoustic wave at said interdigital transducer in case of said nonpiezoelectric plate having a lower phase velocity of the surface acoustic wave traveling thereon alone.

2. A surface acoustic wave transducing device as defined in claim 1 further comprising a supporting board cemented to said lower end surface of said piezoelectric substrate.

3. A surface acoustic wave transducing device comprising:

a piezoelectric substrate made of a piezoelectric ceramic having an upper—and a lower end surfaces running perpendicular to the thickness direction thereof, the polarization axis thereof being parallel to said thickness direction;

a nonpiezoelectric plate having an upper—and a lower end surfaces running perpendicular to the direction of the thickness d thereof; and an interdigital transducer formed on said upper end surface of said piezoelectric substrate, said lower end surface of said nonpiezoelectric plate being cemented on said upper end surface of said piezoelectric substrate through said interdigital transducer, the thickness of said piezoelectric substrate being larger than approximately three times an interdigital periodicity p of said interdigital transducer, said thickness d of said nonpiezoelectric plate being not only smaller than said interdigital periodicity p but also larger than 0.25 times said interdigital periodicity p, said interdigital periodicity p having a dimension larger than 40 μm, said interdigital transducer transducing a surface acoustic wave, with the zeroth mode and the higher order modes, transmitted from said upper end surface of said nonpiezoelectric plate to an area, in contact with said interdigital transducer, of said upper end surface of said piezoelectric substrate, to an electric signal with a frequency approximately corresponding to said interdigital periodicity p, said surface acoustic wave having the wavelength approximately equal to said interdigital periodicity p, the phase velocity of said surface acoustic wave of said zeroth mode being equal to the phase velocity of the Rayleigh wave traveling on said piezoelectric substrate alone under the electrically shorted condition, the phase velocity of said surface acoustic wave of said higher order modes being equal to the phase velocity of the Rayleigh wave traveling on said piezoelectric substrate alone under the electrically opened condition, said nonpiezoelectric plate being made of a material such that the phase velocity of the surface acoustic wave traveling on said nonpiezoelectric plate alone is lower than that traveling on said piezoelectric substrate alone, said nonpiezoelectric plate having a higher transducing efficiency from said surface acoustic wave to said electric signal at said interdigital transducer in case of said nonpiezoelectric plate having a lower phase velocity of the surface acoustic wave traveling thereon alone.

4. A surface acoustic wave transducing device as defined in claim 3 further comprising a supporting board cemented to said lower end surface of said piezoelectric substrate.

* * * * *